(12) United States Patent
Schmidt et al.

(10) Patent No.: US 7,133,286 B2
(45) Date of Patent: Nov. 7, 2006

(54) METHOD AND APPARATUS FOR SEALING A LIQUID COOLED ELECTRONIC DEVICE

(75) Inventors: Roger R. Schmidt, Poughkeepsie, NY (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 331 days.

(21) Appl. No.: 10/842,594

(22) Filed: May 10, 2004

(65) Prior Publication Data

US 2005/0248921 A1    Nov. 10, 2005

(51) Int. Cl.
*H05K 7/20* (2006.01)
*H01L 23/473* (2006.01)

(52) U.S. Cl. .............. 361/718; 361/698; 257/714; 257/717

(58) Field of Classification Search ........... 361/698, 361/718; 257/717, 714
See application file for complete search history.

(56) References Cited

U.S. PATENT DOCUMENTS

| | | | | |
|---|---|---|---|---|
| 3,616,533 A | | 11/1971 | Heap et al. ............... 29/626 |
| 4,029,999 A | | 6/1977 | Neumann et al. ........... 361/386 |
| 4,081,825 A | * | 3/1978 | Koopman et al. .......... 257/713 |
| 4,323,914 A | * | 4/1982 | Berndlmaier et al. ....... 257/713 |
| 5,000,256 A | * | 3/1991 | Tousignant ................. 165/46 |
| 5,001,548 A | * | 3/1991 | Iversen ..................... 257/714 |
| 5,006,924 A | * | 4/1991 | Frankeny et al. .......... 257/714 |
| 5,014,161 A | * | 5/1991 | Lee et al. ................. 361/709 |
| 5,138,523 A | | 8/1992 | Benck et al. ............... 361/386 |
| 5,175,613 A | * | 12/1992 | Barker et al. ............. 257/713 |
| 5,300,810 A | * | 4/1994 | Eden ........................ 257/686 |
| 5,315,480 A | | 5/1994 | Samarov et al. ........... 361/705 |
| 5,426,565 A | * | 6/1995 | Anderson .................. 361/711 |
| 5,528,466 A | | 6/1996 | Lim et al. ................. 361/820 |
| 5,608,610 A | * | 3/1997 | Brzezinski ................. 361/704 |
| 5,648,890 A | * | 7/1997 | Loo et al. ................. 361/704 |
| 5,720,338 A | * | 2/1998 | Larson et al. .............. 165/46 |
| 5,819,402 A | * | 10/1998 | Edwards et al. ............ 29/840 |
| 5,880,524 A | * | 3/1999 | Xie .......................... 257/704 |
| 6,028,351 A | * | 2/2000 | Klonis et al. .............. 257/680 |
| 6,351,384 B1 | * | 2/2002 | Daikoku et al. ........... 361/704 |
| 6,587,345 B1 | | 7/2003 | Chu et al. ................. 361/719 |
| 6,627,997 B1 | * | 9/2003 | Eguchi et al. ............. 257/777 |
| 6,853,071 B1 | * | 2/2005 | Yoshikawa ................ 257/717 |
| 6,972,958 B1 | * | 12/2005 | Mayer ...................... 361/719 |
| 7,030,485 B1 | * | 4/2006 | Houle et al. .............. 257/712 |

OTHER PUBLICATIONS

Universal Option Card Heatsink, IBM Technical Disclosure Bulletin Aug. 1993, pp. 411-412.

* cited by examiner

*Primary Examiner*—Anatoly Vortman
(74) *Attorney, Agent, or Firm*—Cantor Colburn LLP

(57) ABSTRACT

A method and apparatus is disclosed for liquid cooling an electronic device without wetting underside hardware of the electronic device and a substrate to which it is attached. In an exemplary embodiment, an electronic module substrate assembly includes a substrate, an electronic device electrically connected to the substrate, and an elastomer barrier. The barrier includes a cutout configured to sealably affix to chip edges defining the electronic device. The cutout provides fluid communication to a back surface of the electronic device exposed through the cutout while the barrier seals the substrate from such fluid communication.

16 Claims, 2 Drawing Sheets

METHOD AND APPARATUS FOR SEALING A LIQUID COOLED ELECTRONIC DEVICE

BACKGROUND OF THE INVENTION

The present disclosure relates in general to devices used for removing heat from electronic modules, and methods of constructing such devices. In particular, the present disclosure relates to a passivated electronic module substrate assembly, which provides a high effective thermal conductivity path between electronic devices to be cooled and a cooling fluid, while preventing contact between the cooling fluid and metallization layer, as well as associated interconnects, of the electronic devices on the substrate assembly.

As is known, operating electronic devices produce heat. This heat should be removed from the devices in order to maintain device junction temperatures within desirable limits: failure to remove the heat thus produced results in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as the device operating frequencies increase. Second, increased operating frequencies may be possible at lower device junction temperatures. Finally, as more and more devices are packed onto a single chip, power density (Watts/cm$^2$) increases, resulting in the need to remove more power from a given size chip or module. These trends have combined to create applications where it is no longer desirable to remove the heat from modern devices solely by traditional air cooling methods, such as by using traditional air cooled heat sinks. These trends are likely to continue in the foreseeable future, furthering the need for alternatives to traditional air cooling methods.

One approach to avoiding the limitations of traditional air cooling is to use a cooling fluid. As is known, different fluids provide different cooling capabilities. In particular, fluids such as refrigerants or other dielectric fluids exhibit relatively poor thermal conductivity and specific heat properties, when compared to fluids such as water or other aqueous fluids. Dielectric fluids have an advantage, however, in that they may be placed in direct physical contact with electronic devices and interconnects without adverse affects such as corrosion or electrical short circuits. For example, U.S. Pat. No. 6,052,284, entitled "Printed Circuit Board with Electronic Devices Mounted Thereon," describes an apparatus in which a dielectric fluid flows over and around several operating electronic devices, thereby removing heat from the devices. Similar approaches are disclosed in U.S. Pat. No. 5,655,290, entitled "Method for Making a Three-Dimensional Multichip Module," and U.S. Pat. No. 4,888,663, entitled "Cooling System for Electronic Assembly."

Other cooling fluids, such as water or other aqueous fluids, exhibit superior thermal conductivity and specific heat compared to dielectric fluids. The microprocessor heat loads are increasing to a level that it becomes necessary to impinge water jets directly on the back of electronic device chips to maintain the chip junction temperature at a reasonably low value. A low junction temperature of CMOS enhances performance and reliability.

Water-based coolants, however, must be kept from physical contact with electronic devices and interconnects, since corrosion and electrical short circuit problems are likely to result from such contact. Various methods have been disclosed for using water-based coolants, while providing physical separation between the coolant and the electronic devices. For example, U.S. Pat. No. 4,531,146, entitled "Apparatus for Cooling High-Density Integrated Circuit Packages," discloses the use of a conductive foil barrier; U.S. Pat. No. 4,879,629, entitled "Liquid Cooled Multi-chip Integrated Circuit Module Incorporating a Seamless Compliant Member for Leakproof Operation," and IBM Technical Disclosure Bulletin Vol. 20, No. 2, July 1977, entitled "Liquid Cooled Module with Compliant Membrane," disclose the use of a flexible barrier with thermal conduction enhancements (thermal studs and heatsinks, respectively); and U.S. Pat. No. 4,381,032, entitled "Apparatus for Cooling High-Density Integrated Circuit Packages," and U.S. Pat. No. 5,294,830, entitled "Apparatus for Indirect Impingement Cooling of Integrated Circuit Chips," disclose the use of flexible barriers, where pistons are used to maintain contact between the barrier and the devices to be cooled.

An additional problem may arise with the use of a barrier, where the barrier material differs from any of the other materials used to construct the electronic module assembly. While solids in general tend to expand with increasing temperature, the rate of expansion for a given temperature change tends to be characteristic of a particular material. This characteristic, known as the thermal coefficient of expansion (TCE), varies from material to material. Therefore, two structures of different materials, when bonded together at one temperature, will tend to expand at different rates as the temperature of the two materials increases. This difference in expansion rates results in mechanical stresses in the structure, as the temperature of the structure varies in either direction from the temperature at which the devices were bonded (zero stress condition). It is desirable, therefore, for a device employing a cooling fluid barrier to minimize stresses produced within permanently bonded structures composed of a plurality of materials.

For the foregoing reasons, therefore, there is a need in the art for a device capable of providing a high effective thermal conductivity path between a device to be cooled and a water-based coolant, while simultaneously maintaining physical separation between the coolant and other electronic devices and interconnects associated with the substrate assembly and minimizing mechanical stresses caused by mismatches in the thermal coefficients of expansion of various materials within the device assembly.

SUMMARY OF THE INVENTION

One embodiment is an electronic module substrate assembly including a substrate, an electronic device electrically connected to the substrate, and an elastomer barrier. The barrier includes a cutout configured to sealably affix to chip edges defining the electronic device. The cutout provides fluid communication to a back surface of the electronic device exposed through the cutout while the barrier seals the substrate from such fluid communication.

Another embodiment is a method for liquid cooling an electronic device without wetting underside hardware of the electronic device and a substrate to which it is attached. The method includes disposing a first surface defining an elastomer barrier over the substrate. The elastomer barrier includes a cutout aligned with the electronic device. The method further includes mechanically sealing edges defining the cutout with chip edges defining the electronic device so as to allow complete disassembly and re-workability of the electronic device, and sealably affixing a module cap to a second surface opposite the first surface of the barrier. The module cap is configured to provide fluid communication of an aqueous cooling fluid with an exposed surface of the electronic device extending through the cutout.

BRIEF DESCRIPTION OF THE DRAWINGS

Referring to the exemplary drawings wherein like elements are numbered alike in the accompanying Figures.

DETAILED DESCRIPTION OF THE INVENTION

In accordance with exemplary embodiments of the present invention, provided herein is a passivated electronic substrate assembly. The substrate assembly includes a substrate and at least one electronic device to be cooled, which is electrically connected to the substrate. The passivated substrate assembly further includes a thin, impermeable, elastomer barrier having one surface in contact with the substrate and an opposite surface in thermal communication with a heat sink water box. The barrier includes an aperture defined by first edges configured to mechanically couple to chip edges defining the at least one electronic device and provide fluid communication of the heat sink water box with a back surface of the electronic device exposed through the aperture.

Figure 1:
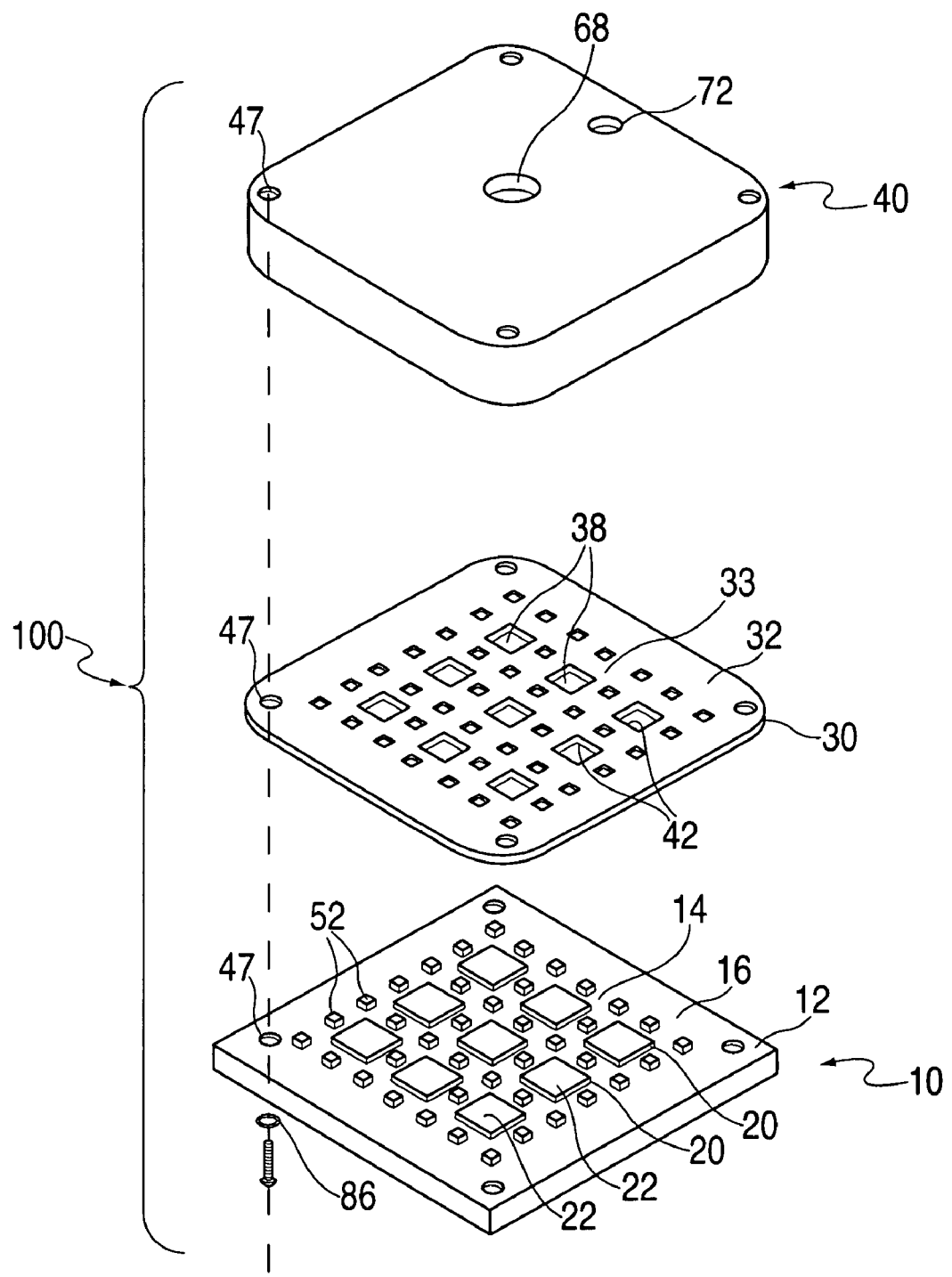
FIG. 1 depicts an exploded perspective view of one embodiment of an electronic module substrate assembly including an electronic device substrate, an elastomer barrier, and a module cap.

FIG. 1 depicts one embodiment of an electronic module substrate assembly 100, comprised of an electronic device substrate 10, an elastomer barrier 30, and module cap or heat sink water box 40. Substrate 10 includes a first or upper surface 12. Substrate first surface 12 includes inner or central area 14, and perimeter area 16. The relative dimensions of central area 14 and perimeter area 16 may differ from those shown in the exemplary embodiment of FIG. 1, in keeping with the spirit and scope of the present invention. Substrate 10 is comprised of materials as known in the art, such as ceramic, glass ceramic, etc. Substrate assembly 100 further includes at least one electronic device 20, electrically connected to central area 14 of substrate 10 first surface 12. Although the embodiment shown in FIG. 1 illustrates a substrate assembly having a plurality of electronic devices 20, the methods of the present invention are in no way limited to any specific number of electronic devices 20. In fact, the methods of the present invention may be applied to an electronic assembly having a single device 20, and may further be applied to assemblies having dozens or even hundreds of devices 20.

Substrate central area 14 generally performs two functions: it provides the mechanical and electrical connections to one or more electronic devices 20, and further provides at least one layer of electrical connections between electronic devices 20 and other electronic devices 20 or external devices. In furtherance of these functions, substrate central area 14 generally includes one or more connection locations or chipsites (not visible, underlying devices 20), one for each device 20 to be connected to central area 14. Furthermore, substrate central area 14 also generally includes electrical connections between devices 20. Contact between either of these regions (chipsites or interconnects) and an electrically conductive material (such as a metal film or an aqueous fluid) is likely to result in undesirable electrical short circuits. Furthermore, contact between either of these regions and an aqueous fluid may lead to corrosion of the electrical contacts and conductors, which is also an undesirable situation.

Substrate perimeter area 16 includes neither device 20 connection nor electrical interconnection functions as found in substrate central area 14, and therefore does not contain chipsites, electrical interconnections, or electronic devices 20. Contact between perimeter area 16 and a conductive material (such as metal or an aqueous solution) does not result in the electrical short circuit or corrosion problems that would result from contact with central area 14.

As previously noted, substrate assembly 100 includes at least one electronic device 20, and may include one or hundreds of devices 20. Device 20 further includes upper surface 22, which generally corresponds to the back side of a semiconductor chip. Other embodiments are envisioned, however, where device 20 is a packaged electronic device rather than an unpackaged semiconductor chip, and surface 22 is therefore an upper surface of the packaged device 20. While exemplary embodiments of the present invention employ a substantially flat surface 22, the methods of the present invention apply to other surface structures, such as curved (convex or concave), rough, or irregular surfaces, provided that surface 22 is not discontinuous at a macroscopic level. Furthermore, the methods of the present invention do not require absolutely parallel alignment between device upper surface 22 and substrate first surface 12, nor do the methods of the present invention require precise alignment between surface 22 of one device 20 and surface 22 of any other device 20. In general, the methods of the present invention apply even in the presence of relatively minor imperfections such as defects, curvature, and tilting of surface 22.

Figure 2:
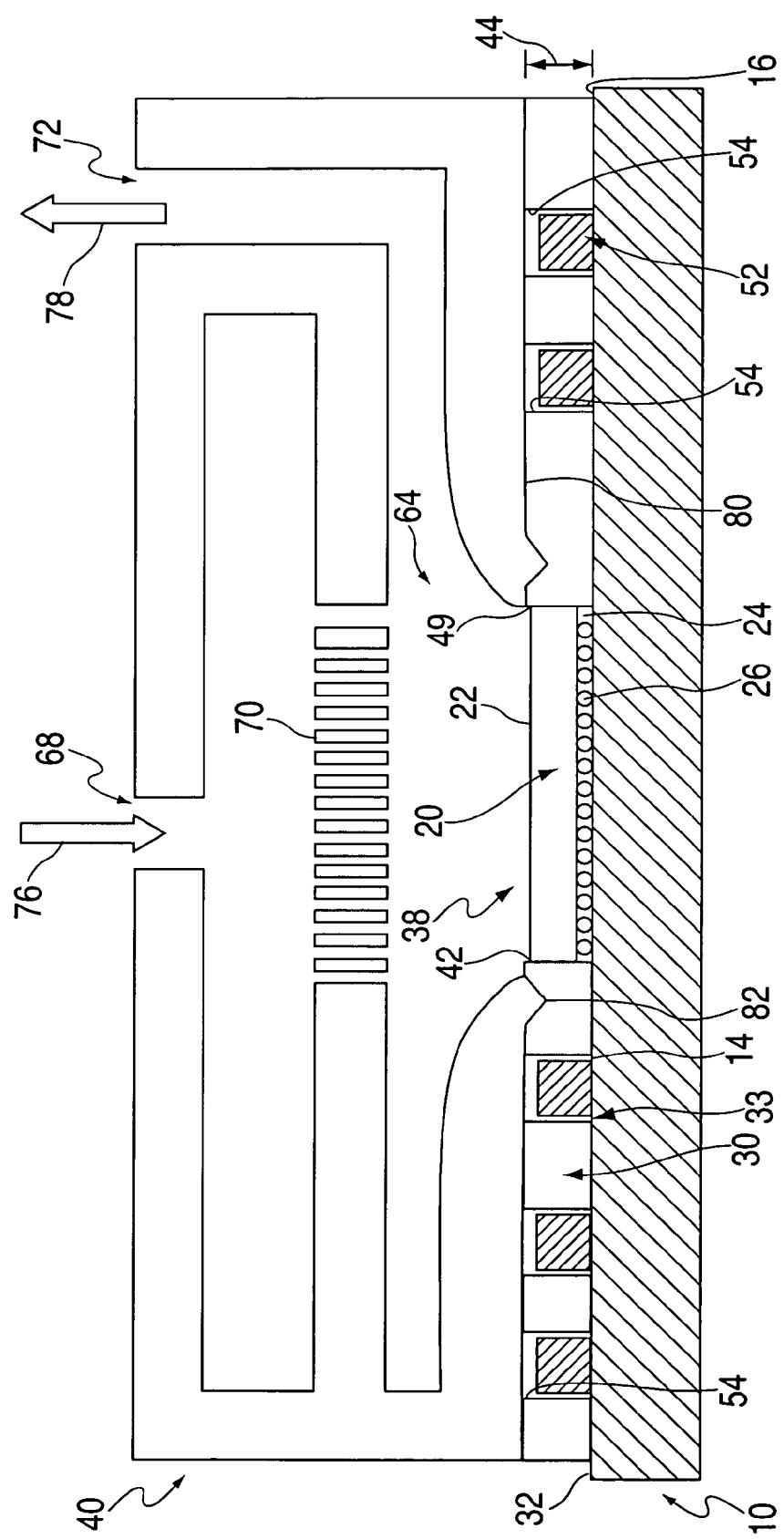
FIG. 2 depicts a partial cross section view of the electronic module substrate assembly of FIG. 1 assembled together.

As seen in FIG. 2, device 20 further includes a lower surface 24, terminating in a plurality of electrical connections 26 to substrate central area 14. Connections 26 are preferably controlled collapse chip connects (C4s), however connections 26 may be any suitable electrical connection between device lower surface 24 and central area 14.

FIG. 1 further illustrates barrier 30 in relation to substrate 10. In particular, barrier 30 is positioned over the first surface 12 of substrate 10. Barrier 30 and substrate first surface 12 are similar in shape and size. Barrier 30 includes an outer perimeter area 32, comparable in size and shape to substrate perimeter area 16, and positioned directly above substrate perimeter area 16. Barrier 30 further includes central area 33, likewise comparable in size and shape to substrate central area 14, and positioned directly above substrate central area 14. While the shape and dimensions of corresponding areas of barrier 30 and substrate 10 are comparable, minor differences in shape and size may be tolerated within the spirit and scope of the present invention. A minor difference in shape or dimension is one which does not impair the function of the individual components, or the assembly as a whole.

With reference now to FIGS. 1 and 2, further details of barrier 30 are described. FIG. 2 illustrates an exemplary embodiment of barrier 30, corresponding to the assembly embodiment illustrated in FIG. 1. As seen from the top in FIGS. 1 and 2, barrier 30 includes a substantially flat perimeter area 32, forming the outermost region of barrier 30. Enclosed by perimeter area 32, barrier 30 includes central area 33. Within barrier central area 33, barrier 30 further includes at least one device contact area or cutout 38. In the exemplary embodiment of FIG. 1, nine device contact areas are illustrated, corresponding to the nine devices 20 illustrated on substrate 10 of FIG. 1. Substantially surrounding or circumscribing the at least one device contact area 38, barrier 30 further includes edges 42 defining each cutout 38. As previously noted, substrate assembly 100 may include any number of devices 20. Barrier 30 may therefore include any number of device contact areas 38 and associated edges 42. In exemplary embodiments, barrier 30 includes one device contact area 38, defined by four edges 42, for and associated with each device 20. In general, however, barrier 30 may include more contact areas 38 than devices 20, or fewer contact areas 38 than devices 20, within the spirit and scope of the present invention.

FIG. 2 depicts the surfaces that are ultimately attached to substrate perimeter 16, and device 20 upper surface 22. In particular, FIG. 2 depicts a substantially flat perimeter area 32 and central area 33, which is attached to substrate perimeter area 16 and substrate central area 14, respectively, in assembly 100. FIG. 2 also depicts several device contact areas 38, which allow fluid communication therethrough to the upper surfaces 22 of devices 20 in assembly 100. As described herein, barrier 30 generally includes an upper surface and a lower surface, each of which may serve different functions. In addition, device contact areas 38 include a cutout as illustrated in FIGS. 1 and 2, which provides fluid communication of a cooling fluid from above an upper surface of barrier 30 to upper surfaces 22 of devices 20.

Barrier 30 preferably provides a low thermal resistance path between device 20 and any fluid in contact through device contact area 38 (such as a cooling fluid). Also, barrier 30 preferably prevents fluid contact with substrate 10 and interconnects of devices 20 to substrate 10. Preferably, therefore, the material or materials used to form barrier 30 should be impermeable. Finally, the material should be relatively incompressible to reduce stress relax, thereby reducing mechanical stress on device 20 while allowing stretching of cutout 38 to sealably affix to chip edges of device 20. Any materials meeting these requirements may be used to form barrier 30, and are therefore within the spirit and scope of the present invention. In particular, elastomers such as rubber, for example, exhibit suitable characteristics for barrier 30. Of these materials, butyl rubber appears to offer superior overall characteristics.

Alternatively, barrier 30 may be a composite or layered structure, formed of multiple sheets or layers of different elastomers. For example, barrier 30 may be composed of a relatively thick layer of butyl rubber, with a relatively thin layer of a moisture impervious material deposited on the lower surface and/or the upper surface. One example includes disposing metal on an upper surface, as metal on the lower surface would induce shorting with the electronic devices disposed below. Other such combinations apparent to one of ordinary skill in the art are within the spirit and scope of the present invention.

Barrier 30 may be of various thicknesses, however due to practical considerations, barrier 30 is preferably neither too thick nor too thin. In particular, barrier 30 is preferably continuous throughout, without seams, breaks, or pinholes through which a cooling fluid might pass other than cutouts 38. While barrier 30 may in theory be quite thin, practical considerations make it desirable for barrier 30 to be thicker than some practical minimum, typically at least 0.75 mm thick or at least as thick as upper surface 22 extending from substrate 10 (e.g., 0.85 mm). Furthermore, while barrier 30 may in theory be quite thick, practical considerations make it desirable for barrier 30 to be thinner than some practical maximum, no more than about 1.25 mm thick. In particular, it may be more difficult to stretch cutout 38 in a thicker barrier 30. Furthermore, as the thickness of barrier 30 increases, so does the thermal resistance of the path between other devices mounted on substrate 10. Therefore, while barrier 30 may in theory be of a range of thicknesses, practical considerations suggest that barrier 30 thickness is preferably in the range of from approximately 0.75 mm to approximately 1.25 mm. However, other ranges are contemplated suitable for the desired end purpose.

Still referring to FIGS. 1 and 2, a lower surface of barrier perimeter area 32 is affixed to substrate 10 perimeter area 16 while an upper surface thereof is affixed to a lower surface defining module cap 40. A mechanical fastener 45, such as a threaded bolt, for example, is used to affix and seal barrier perimeter 32 to substrate perimeter 16 and a perimeter defining a lower surface of module cap 40. Cutouts 38 are sealably affixed to chip edges 49 of respective devices 20 by stretching edges 42 defining each cutout 38 over a corresponding device to form a hermetic seal, to prevent oxygen from contacting portions below upper surface 22 of device 20, substrate 10, or interconnects 26 therebetween, thereby causing corrosion.

With reference still to FIG. 1 and additional details of an embodiment of assembly 100 are provided. FIG. 2 depicts a partial cross-sectional view of the exploded view shown in FIG. 1. In particular, FIG. 2 depicts how the topology of barrier 30 relates to the underlying structure of substrate 10 and devices attached thereto. As previously noted, barrier perimeter 32 is compressed to substrate perimeter 16, with mechanical fasteners 45 extending through corresponding apertures 47 in substrate 10 and barrier 30 threadably received in module cap 40.

Device contact area 38 is shown to be as wide as device 20 in FIG. 2, however, it will be recognized by one skilled in the art that a perimeter defining device contact area 38 is dimensioned smaller than a perimeter defining chip edges 49 to form a hermetic seal therearound, as discussed above. Alternative embodiments are envisioned wherein contact area 38 is somewhat smaller than device 20, all within the spirit and scope of the present invention. Alternative embodiments are also envisioned where a plurality of devices 20 with different dimensions are used: in such embodiments, each contact area 38 within barrier 30 being of a somewhat smaller size than a device 20 aligned therewith, and may also be of a different shape, and/or at a different height.

FIG. 2 further illustrates a height of barrier 30 generally at 44, which is preferably higher than device 20 or any devices connected to substrate 10. As it will be recognized, since substrate central area 14 typically contains a plurality of electrical interconnections, contact between a conductor such as module cap 40 and any of the plurality of interconnections within central area 14 is likely to produce undesirable short circuits.

FIGS. 1 and 2 illustrate another aspect of exemplary embodiments of the present invention. Substrate 10 may optionally include one or more passive devices 52, such as resistors or decoupling capacitors (decaps). While these devices are by no means required in any specific embodiments of the present invention, it is seen that the methods of the present invention may be applied to assemblies including passive devices 52. In particular, FIG. 2 depicts passive devices 52 which are narrower and shown to be substantially the same height as device 20. As illustrated in FIG. 2, corresponding cutouts 54 are designed such that edges defining each remain out of contact with the passive devices 52. Alternative embodiments are envisioned wherein passive devices 52 are taller or shorter than devices 20, as well as embodiments wherein a plurality of passive devices of varying heights are employed.

Several alternative embodiments are envisioned, within the spirit and scope of the present invention. As previously noted, the teachings of the present invention may be advantageously applied to substrate assemblies including a single device 20, and without a passive device 52. Assemblies 100 having a plurality of devices are also envisioned, wherein devices 20 may be similar or dissimilar. In particular, devices 20 (and upper surfaces 22) may differ in shape, contact area, topology, alignment, orientation, height, packaging (i.e., bare die vs. packaged chips or modules), power dissipation, etc. By varying the size and shape of contact areas 38 in accordance with the specific requirements of a particular design, a wide variety of device combinations may be accommodated using the methods of the present invention. Furthermore, in embodiments including at least one high power device 20 and at least one low power device 20, it may be possible or even desirable to only provide contact area 38 for the high power device.

FIGS. 1 and 2 illustrate exemplary embodiments of an electronic device employing a passivated substrate assembly, in accordance with the teachings of the present invention. In particular, FIG. 1 illustrates an exploded view of assembly 100, while FIG. 2 illustrates a cross section portion of assembly 100 illustrated in FIG. 1. As shown in the figures, conductive module cap 40 has an outer edge that is substantially the same shape and size as the outermost edge of barrier 30, and is preferably aligned thereto. Cap 40 provides a fluid-tight, low permeability seal with an upper surface of barrier 30.

Module cap 40 defines an enclosed volume 64. Enclosed volume 64 is preferably filled with a cooling fluid. A fluid inlet 68 may be used to introduce a cooling fluid into volume 64 while directing the fluid through a water jet plate 70 to directly impinge the cooling fluid on upper surface 22 of device 20 to effect cooling thereof. An outlet 72 is configured in module cap 40 to allow the heated cooling fluid to escape from volume 64 and allow colder cooling fluid in through inlet 68. Cooling fluid flow through inlet 68 and outlet 72 is generally indicated with flow arrows 74 and 76, respectively. Cooling fluids such as water or other aqueous fluids, such as brine, are preferred. Dielectric fluids may also be used, however, the superior thermal conductivity and specific heat of aqueous fluids make aqueous cooling fluids a preferred choice. When volume 64 is thus filled with a cooling fluid, the cooling fluid thus transfers heat from upper surface 22 of device 20 through barrier 30 (via fluid communication through cutout 38) to module cap 40. The primary thermal transfer mechanism in such an embodiment is therefore convection. Various methods as known in the art may be used to cool and/or to remove heat from module cap 40.

In particular, FIG. 2 depicts module cap 40 as a heat sink water box having two ports, inlet 68 and outlet 72. Ports 68 and 72 are used to provide a flow of fluid through volume 64, thereby increasing the heat removal capability of the assembly. Port 68 serves as an inlet, while port 72 serves as an outlet, both connecting to an external system (not shown) thereby creating a closed loop fluid flow path. The assignment of ports 68 as an inlet and 72 as an outlet is clearly interchangeable. In such an embodiment, a cooling fluid removes heat from upper surface 22 of device through cutout 38 of barrier 30 by convection. The temperature of the cooling fluid leaving volume 64 is thus increased in relation to the temperature of cooling fluid entering volume 64. The higher temperature cooling fluid passes through a heat exchanger prior to returning to inlet port 68 for reintroduction into volume 64. Alternative embodiments are envisioned, using: more than two ports, or a plenum arrangement to distribute fluid within volume 64, or using a baffle arrangement (e.g., water jet plate 70) within volume 64 to control and direct fluid flow within volume 64. Each of these alternatives may be used alone, or in conjunction with any other combination of alternatives.

Another alternative embodiment which may be advantageously employed to remove heat from a fluid within volume 64 involves partially filling volume 64 with a cooling fluid, allowing the fluid to boil or evaporate, and providing an external condenser connected to ports 68 and 72, whereby cooling fluid exits volume 64 through outlet port 72 in vapor phase, and returns to volume 64 through inlet port 68 in liquid phase. One such device, using a plurality of ports 68 and a plurality of ports 72, is described in application Ser. No. 10/040,680, filed Nov. 9, 2001, entitled "Enhanced Air Cooling of Electronic Devices using Fluid Phase Change Heat Transfer."

In an exemplary embodiment as depicted in FIG. 2, a bottom surface 80 of module cap 40 includes a ridge 82 extending therefrom. Ridge 82 is substantially aligned with a perimeter defining each cutout 38 and is configured to press into a facing surface of barrier 30 and increase compression of the edges 42 defining each cutout 38 on the chip edges 49. This pressing action from ridge 82 increases compression of edges 42 of barrier 300 on chip edges 49 of device 20, thus improving the seal between device 20 and barrier 30.

In an exemplary embodiment referring to FIG. 1, substrate 10 is bolted to module cap 40 with barrier 30 therebetween using a biasing member 86 with bolts 45 to keep the seal from relaxing over the life of the product. Biasing member 86 includes a Belleville washer, for example, but is not limited thereto. It will be recognized by one skilled in the pertinent art that barrier 30 is a relatively incompressible elastomer well confined between module cap 40, device 20, and substrate 10. Therefore a volume into which the elastomer barrier 30 can flow to stress relax is quite limited. Accordingly, motion of module cap 40 over the life of the product is very limited.

Barrier 30 may be formed using a variety of methods. In particular, barrier 30 may be formed by cutting a blank from a continuous sheet of material, then forming cutouts 38 and 54, by stamping the blank between two conforming molds. This method may be used in any application employing a suitably elastomeric material (such as butyl rubber) for barrier 30.

The process of assembling electronic module substrate assembly 100 involves three starting materials: substrate 10, with devices 20 attached thereto; barrier 30, preformed with the various cutouts 38 and 54 as previously described; and module cap, which may be a heat sink water box, as discussed in detail above. These components are illustrated in FIG. 1. Alternative embodiments are envisioned, wherein substrate assembly 100 further includes one or more passive devices 52, as illustrated in FIGS. 1 and 2. The seal created between the chip edges 49 and edges 42 defining cutout 38 is purely mechanical. Since no epoxy sealing is utilized, device 20 is not mechanically stressed by any epoxy bond and the device 20 is reworkable. While limiting corrosion thereto when an aqueous cooling fluid is directed to the backside of device 20. The above described exemplary embodiments isolate a metallization and C4 structure on layer on the substrate from water in a more convenient and cost reduced approach than when using an epoxy.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention is not to be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. An electronic module substrate assembly comprising:
   a substrate;
   an electronic device electrically connected to said substrate;
   an elastomer barrier, said barrier having a cutout configured to sealably affix to chip edges defining said electronic device, the cutout providing fluid communication to a back surface of the electronic device exposed through the cutout while said barrier seals said substrate from said fluid communication; and
   at least one passive electronic device electrically connected to said substrate, wherein said elastomer includes a second cutout aligned with said at least one passive electronic device, said second cutout defined by a second perimeter larger than a first perimeter defining said at least one passive electronic device.

2. The apparatus of claim 1, wherein said substrate assembly includes a plurality of said electronic devices and a plurality of cutouts in said barrier aligned with a corresponding electronic device.

3. The apparatus of claim 1, wherein said second perimeter is dimensioned to avoid contact with said at least one passive electronic device.

4. The apparatus of claim 1, wherein said elastomer barrier includes butyl rubber.

5. The apparatus of claim 1, wherein said barrier is hermetically sealed to said chip edges of said electronic device by mechanical means allowing rework of said electronic device.

6. The apparatus of claim 5, wherein said mechanical means is configured to reduce mechanical stress to said electronic device.

7. The apparatus of claim 1, wherein said barrier is sealably affixed to said electronic device by stretching said cutout to fit around said chip edges defining said electronic device.

8. The apparatus of claim 1, further comprising a means to bring water in fluid communication with said electronic device without wetting said substrate and interconnects between said substrate and said electronic device.

9. The apparatus of claim 8, wherein said means includes a heat sink water box, said barrier disposed between said substrate and said heat sink water box.

10. The apparatus of claim 9, wherein said heat sink water box is mechanically fastened to said substrate using mechanical fasteners.

11. The apparatus of claim 10, wherein said mechanical fasteners include a biasing member configured to prevent said barrier from stress relaxing.

12. The apparatus of claim 11, wherein said mechanical fasteners includes bolts and biasing member includes belleville washers.

13. The apparatus of claim 10, wherein said heat sink water box includes a ridge extending from a facing surface thereof, said ridge substantially aligned with a perimeter defining said cutout, said ridge configured to press into a facing surface of said barrier and increase compression of said edges defining said cutout on said chip edges.

14. An electronic module comprising:
    a substrate;
    an electronic device electrically connected to said substrate;
    an elastomer barrier, said barrier having a cutout configured to sealably affix to chip edges defining said electronic device, the cutout providing fluid communication to a back surface of the electronic device exposed through the cutout while said barrier seals said substrate from said fluid communication;
    a module cap sealably affixed to an upper surface of said barrier, said cap and said barrier forming an internal volume containing an aqueous cooling fluid;
    a fluid inlet and a fluid outlet; and
    at least one passive electronic device electrically connected to said substrate, wherein said elastomer includes a second cutout aligned with said at least one passive electronic device, said second cutout defined by a second perimeter larger than a first perimeter defining said at least one passive electronic device.

15. The apparatus of claim 14, wherein said module includes a ridge extending from a facing surface thereof, said ridge substantially aligned with a perimeter defining said cutout, said ridge configured to press into a facing surface of said barrier and increase compression of said edges defining said cutout on said chip edges.

16. A method for liquid cooling an electronic device without wetting underside hardware of the electronic device and a substrate to which it is attached, the method comprising:
    disposing a first surface defining an elastomer barrier over the substrate, said elastomer barrier having a cutout aligned with the electronic device;
    mechanically sealing edges defining said cutout with chip edges defining the electronic device so as to allow complete disassembly and re-workability of the electronic device;
    sealably affixing a module cap to a second surface opposite said first surface of said barrier, said module cap configured to provide fluid communication of an aqueous cooling fluid with an exposed surface of the electronic device extending though said cutout;
    configuring a ridge extending from a surface of said module cap in communication with said second surface of said elastomer barrier, said ridge substantially aligned with a perimeter defining said cutout, said ridge configured to press into said second surface proximate said perimeter defining said cutout of said barrier and increase compression of said edges defining said cutout on said chip edges to enhance a seal therebetween; and
    configuring a second cutout aligned with each at least one passive electronic device extending from the substrate, wherein each corresponding said second cutout is defined by a second perimeter larger than a first perimeter defining each corresponding said at least one passive electronic device.

* * * * *